(12) United States Patent
Kim et al.

(10) Patent No.: US 10,833,898 B2
(45) Date of Patent: Nov. 10, 2020

(54) BASELINE WANDER CORRECTION IN AC COUPLED COMMUNICATION LINKS USING EQUALIZER WITH ACTIVE FEEDBACK

(71) Applicant: Oracle International Corporation, Redwood City, CA (US)

(72) Inventors: Kunmo Kim, Santa Clara, CA (US); Rajesh Kumar, Campbell, CA (US); Dawei Huang, San Diego, CA (US); Frankie Liu, Palo Alto, CA (US); Suwen Yang, Belmont, CA (US)

(73) Assignee: Oracle International Corporation, Redwood Shores, CA (US)

(*) Notice: Subject to any disclaimer, the term of this patent is extended or adjusted under 35 U.S.C. 154(b) by 0 days.

(21) Appl. No.: 15/857,891

(22) Filed: Dec. 29, 2017

(65) Prior Publication Data

US 2019/0207789 A1 Jul. 4, 2019

(51) Int. Cl.
| | | |
|---|---|---|
| H04L 25/03 | (2006.01) | |
| H03K 5/007 | (2006.01) | |
| H04B 1/04 | (2006.01) | |
| H03F 3/45 | (2006.01) | |
| H03H 7/01 | (2006.01) | |

(52) U.S. Cl.
CPC ....... *H04L 25/03949* (2013.01); *H03K 5/007* (2013.01); *H03F 3/45179* (2013.01); *H03H 7/01* (2013.01); *H04B 1/0475* (2013.01)

(58) Field of Classification Search
USPC ........................................ 375/232
See application file for complete search history.

(56) References Cited

U.S. PATENT DOCUMENTS

| | | | |
|---|---|---|---|
| 6,542,540 B1* | 4/2003 | Leung | H04L 25/03885 333/28 R |
| 7,924,079 B2 | 4/2011 | Schmand | |
| 7,961,817 B2 | 6/2011 | Dong | |
| 9,306,775 B1 | 4/2016 | Kotagiri | |
| 9,485,120 B1 | 11/2016 | Sun | |
| 9,698,735 B1 | 7/2017 | McCue | |
| 2003/0064696 A1* | 4/2003 | Akamine | H03G 3/3052 455/311 |
| 2005/0062531 A1* | 3/2005 | Schreyer | H03F 1/3247 330/149 |
| 2009/0302888 A1* | 12/2009 | Shumarayev | H03F 3/45197 326/62 |
| 2010/0156538 A1* | 6/2010 | Ogasawara | H03F 3/45475 330/277 |

* cited by examiner

*Primary Examiner* — Wednel Cadeau
(74) *Attorney, Agent, or Firm* — Kowert, Hood, Munyon, Rankin & Goetzel, P.C.

(57) ABSTRACT

A method and apparatus for correcting baseline wander is disclosed. The method and apparatus may include generating filtered signals by filtering input signals using a filter circuit. An equalizer circuit using the filtered signals may generate output signals. Feedback networks may be configured to couple a respective output signal to a corresponding filtered signal.

19 Claims, 5 Drawing Sheets

BASELINE WANDER CORRECTION IN AC COUPLED COMMUNICATION LINKS USING EQUALIZER WITH ACTIVE FEEDBACK

BACKGROUND

Technical Field

Embodiments described herein are related to the field of high-speed interface design, and more particularly to reducing baseline wander.

Description of the Related Art

Computing systems typically include a number of interconnected integrated circuits. In some cases, the integrated circuits may communicate using communication channels or links to transmit and receive data bits. The communication channels may support parallel communication, in which multiple data bits are transmitted in parallel, or serial communication, in which data bits are transmitted one bit at a time in a serial fashion.

The data transmitted between integrated circuits may be encoded to aid in transmission. For example, in the case of serial communication, data may be encoded to provide sufficient transitions between logic states to allow for clock and data recovery circuits to operate. Alternatively, in the case of parallel communication, the data may be encoded to reduce switching noise or to improve signal integrity.

During transmission of the data, the physical characteristics of the communication channel may attenuate a transmitted signal associated with a particular data bit. For example, the impedance of wiring included in the communication channel or link may attenuate certain frequency ranges of the transmitted signal. Additionally, impedance mismatches between wiring included in the communication channel and devices coupled to the communication channel may induce reflections of the transmitted signal, which may degrade subsequently transmitted signals corresponding to other data bits.

SUMMARY OF THE EMBODIMENTS

Various embodiments of an apparatus and method for reducing baseline wander in a computing system are disclosed. Broadly speaking, a method and apparatus are contemplated, in which a filter circuit may be configured to filter first and second input signals, received via a communication link, to generate first and second filtered signals. An equalizer circuit may amplify a difference between voltage levels of the first and second input signals to generate first and second output signals. A first feedback network may couple the first output signal to the first filtered signal, and a second feedback network may couple the second output signal to the second filtered signal.

In one embodiment, the filter circuit includes a plurality of capacitors.

In another specific embodiment, the first feedback network may include one or more first resistors. The second feedback network may include one or more second resistors.

BRIEF DESCRIPTION OF THE DRAWINGS

The following detailed description makes reference to the accompanying drawings, which are now briefly described.

Figure 1:
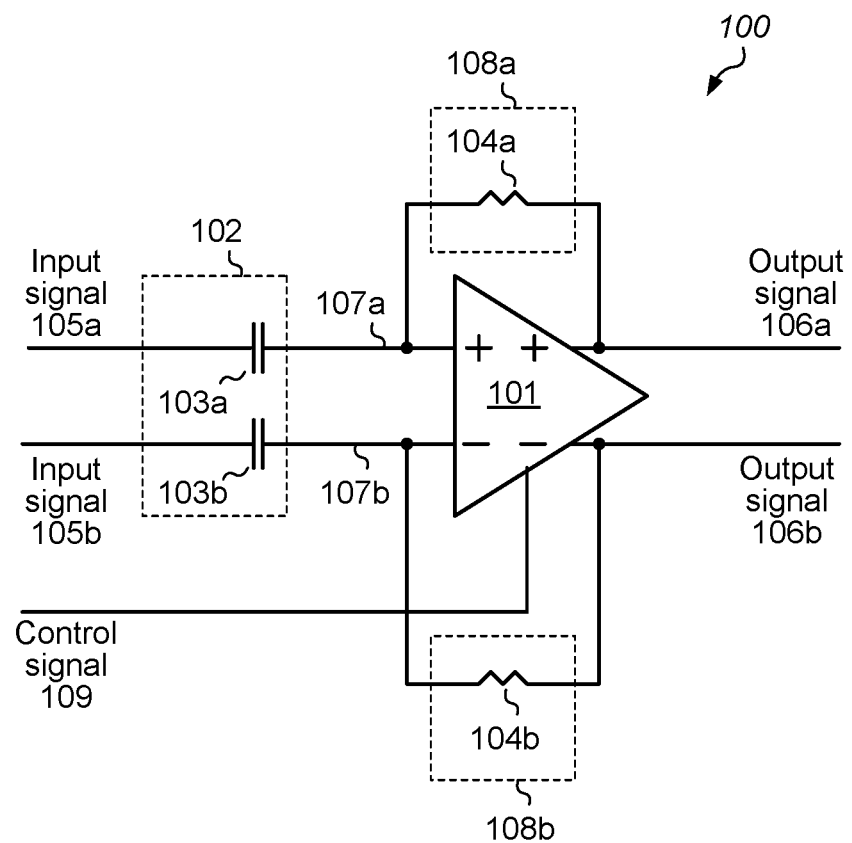
FIG. 1 is a block diagram that illustrates an embodiment of a front-end of a data receiver circuit that includes an equalizer circuit with active feedback.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

A computing system may include one or more integrated circuits, such as, e.g., a central processing unit (CPU) and memories. Each one of the integrated circuits of the computing system may communicate through either a serial or parallel interface. In a parallel interface, multiple data bits are communicated simultaneously, while in a serial interface, data is communicated as a series of sequential single data bits. When employing a serial interface to communicate data between two devices included in a computing system, the data may be transmitted according to different protocols. For example, the data may be transmitted using return to zero (RZ), non-return to zero (NRZ), pulse amplitude modulation (PAM), or any suitable combination thereof.

In the computing system, different devices may have different electrical operating parameters. As such, devices may be AC coupled using a series capacitor to a communication channel or link between the devices, which removes the DC component of the transmitted signals. In various embodiments, use of such series capacitors may allow for the common-mode of the received signal to be independently defined regardless of common-mode voltage from the transmitter. Since there is no common DC reference between devices, the DC level at a receiving device is dependent upon the received data. This dependency on the data of the DC level at the receiving device is commonly referred to as "baseline wander."

To compensate for the movement in the baseline, a slow filter may be employed to limit excursions in the baseline makes as the received data changes. Such filter circuits may include analog circuits, which dissipate considerable power, as well as large value passive components, which are difficult to fabricate on an integrated circuit. The embodiments illustrated in the drawings and described herein may provide techniques for mitigating the effects of baseline wander, while reducing power dissipation and allowing for smaller on-chip passive components.

An embodiment of a data receiver circuit is illustrated in FIG. 1. In the illustrated embodiment, data receiver circuit 100 includes equalizer circuit 101, filter circuit 102, and feedback networks 108a and 108b. It is noted that in various embodiments, equalizer circuit 101, filter circuit 102, and feedback networks 108a and 108b may be fabricated on a common integrated circuit.

Input signals 105a and 105b are coupled to filter circuit 102, which filters input signals 105a and 105b to generate filtered signal 107a and 107b, respectively. In various embodiments, filter circuit 102 may be a high pass filter that attenuates low frequency, including DC, components of input signals 105a and 105b. Input signals 105a and 105b may be transmitted to data receiver circuit 100 from another device in a computing system via a communication channel or link.

In some embodiments, filter circuit 102 includes capacitors 103a and 103b. Capacitor 103a is coupled between input signal 105a and filtered signal 107a, and capacitor 103b is coupled between input signal 105b and filtered signal 107b.

Equalizer circuit 101 may be configured to generate output signals 106a and 106b using filtered signal 107a and filtered signal 107b. As described below in more detail in regard to FIG. 3, equalizer circuit 101 may employ multiple stages of amplification, which have less gain at lower frequencies than higher frequencies, thereby implementing a high pass transfer function. Such a transfer function may, in various embodiments, compensate for losses in the communication channel through which input signals 105a and 105b are transmitted. In some embodiments, equalizer circuit 101 may be a continuous time linear equalizer or other suitable equalizer circuit.

The peaking frequency of equalizer circuit 101 may, in some embodiments, be selected to be greater than a cutoff frequency of a load circuit coupled to equalizer circuit 101. By selecting the peaking frequency of equalizer circuit 101 in such a fashion, undesirable circuit operation, such as, e.g., oscillations, may be avoided. In various embodiment, the gain of equalizer circuit 101 may be adjustable using control signal 109. As described below in more detail, a digital logic circuit may be configured to generate control signal 109 to adjust the DC gain of equalizer circuit 101 to unity. By adjusting the gain of equalizer circuit 101 in such a fashion, the loop time constant may be maximized, which may minimizing baseline wander effect of front-end circuit 100, thereby reducing a bit error rate associated with input signals 105a and 105b.

Feedback network 108a is configured to couple output signal 106a to filtered signal 107a, thereby providing positive feedback from a positive output terminal of equalizer circuit 101 to a positive input terminal of equalizer circuit 101. In a similar fashion, feedback network 108b is configured to couple output signal 106b to filtered signal 107b, thereby providing positive feedback from a negative output terminal of equalizer circuit 101 to a negative input terminal of equalizer circuit 101. The feedback networks may, in various embodiments, form low pass filters preventing high frequency components of outputs signals 106a and 106b from coupling into filtered signal 107a and filtered signal 107b. In the illustrated embodiment, feedback network 108a includes resistor 104a, and feedback network 108b includes resistor 104b. Although only one resistor is depicted in each of the feedback networks, in other embodiments, any suitable number of resistors, or other passive circuit components, may be employed.

In addition to providing a low pass filtering, feedback network 108a and 108b may also be configured to determine the DC common mode operating voltage of input signals 105a and 105b. using output signals 106a and 106b. For example, in some embodiments, the DC common mode operating voltage of input signal 105a may be based on the DC common mode operating voltage of output signal 106a. By determining the DC common mode operating voltages of the input signals in such a fashion, additional bias circuits coupled to input signals 105a and 105b may be omitted, thereby saving circuit area and reducing power consumption.

Resistor 104a allows a current to flow from output signal 106a to filtered signal 107a, and resistor 104b allows a current to flow from output signal 106b to filtered signal 107b. The values of the currents may be determined by the values of the resistors as well as the relative difference in voltage levels between output signal 106a and filtered signal 107a, and output signal 106b and filtered signal 107b. By allowing the aforementioned currents to flow from the output signals to the filtered signals, a dynamic adjustment to the voltage levels of filtered signals 107a and 107b may be made that reduce baseline wander. Since the currents are generated using resistors, dissipated power may be reduced over baseline wander correction circuits that employ active current sources.

The values of resistors 104a and 104b, as well as capacitors 103a and 103b may be selected to set a pole frequency for the transfer function of data receiver circuit 100. The transfer function of data receiver circuit 100 is depicted in equation 1, where A(s) is the gain of equalizer circuit 101, C is a value of capacitor 103a or 103b, and R is a value of resistors 104a or 104b.

$$H(s) = A(s)\left(\frac{1}{1+\frac{1-A(s)}{sCR}}\right) \tag{1}$$

The pole frequency of the transfer function is depicted in equation 2, where AO is the DC gain of equalizer circuit 101. In various embodiments, the pole frequency is selected to greater than a pole frequency of the communication channel or link to which data receiver circuit 100 is coupled.

$$f_{pole} \approx \frac{1-A_0}{2\pi RC} \tag{2}$$

Another constraint in selecting the component values for filter circuit 102, and feedback networks 108a and 108b is the loop time constant. An approximate expression for the loop time constant is depicted in equation 3. In various embodiments, the loop time constant should be selected to be greater than a period of time between consecutive bits transmitted via the communication channel or link.

$$\tau_{loop} \approx \frac{RC}{1-A_0} \tag{3}$$

It is noted that the embodiment illustrated in FIG. 1 is merely an example. In other embodiments, different circuit components and different arrangements of circuit components are possible and contemplated.

Figure 2:
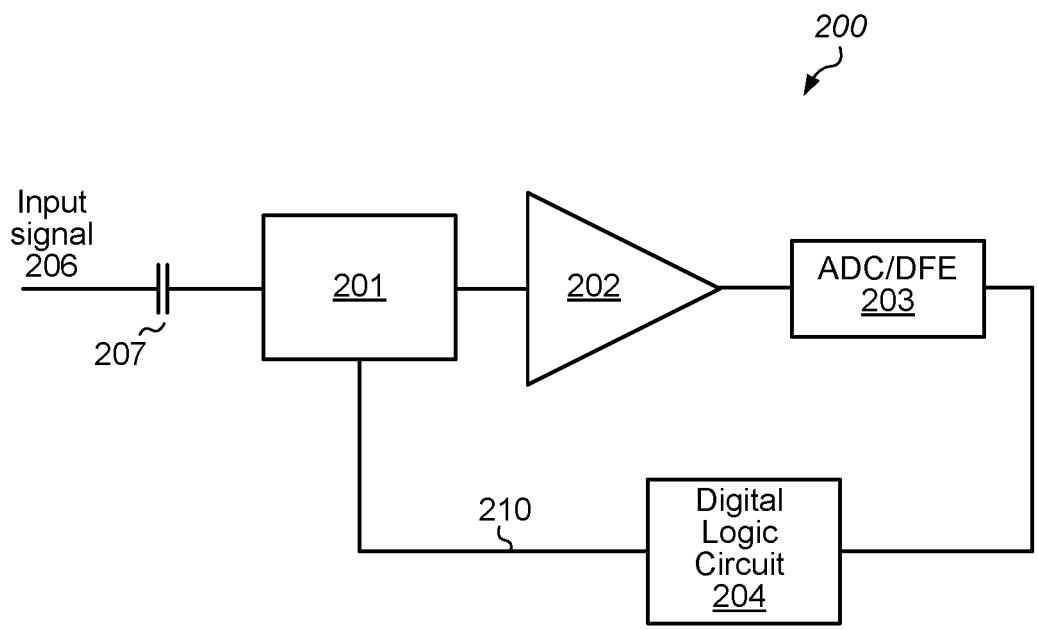
FIG. 2 is a block diagram that illustrates an embodiment of a data receiver circuit.

An embodiment of a data receiver is illustrated in FIG. 2. In the illustrated embodiment, data receiver 200 includes front-end circuit 201, pre-driver 202, analog-to-digital converter (ADC)/decision feedback equalizer (DFE) 203, and digital logic circuit 204.

Input signal 206 is coupled to an input of front-end circuit 201 via capacitor 207. In various embodiments, capacitor 207 attenuates low frequencies, possibly including a DC level, associated with input signal 206. Input signal 206 may be received via a communication link or channel. Although input signal 206 is depicted as being a single wire, in other embodiments, input signal 206 may include multiple wires, and may employ differential encoding of data bits. It is noted that, in various embodiments, capacitor 207 may be included in front-end circuit 201 in a fashion similar to capacitors 103a and 103b of FIG. 1.

Front-end circuit 201 may be configured to amplifier certain frequency ranges included in input signal 206. In various embodiments, front-end circuit 201 may correspond to front-end circuit 100 as depicted in FIG. 1. Front-end circuit 201 may have a low gain level at frequencies less than an operating frequency associated with input signal 206. In various embodiments, front-end circuit 201 may include a differential amplifier and be a particular embodiment of a continuous time linear equalizer (CTLE) that employs positive feedback as described above in regard to FIG. 1.

The output of front-end circuit 201 is coupled to an input of pre-driver 202. In various embodiments, pre-driver 202 include a variable gain amplifier configured to amplify the output of front-end circuit 201. Pre-driver 202 may, in some embodiments, include a differential amplifier, programmable gain amplifier, linear equalizer, or any other suitable amplifier circuit.

ADC/DFE 203 includes two different circuit blocks, each performing a specific function. The ADC portion of the ADC/DFE 203 is configured to convert the analog signal from pre-driver 202 into one or more data bits. In various embodiments, the ADC portion of ADC/DFE 203 may be designed according to one of various design styles. For example, ADC/DFE 203 may include a direct-conversion ADC, a successive approximation ADC, or any other suitable ADC circuit.

The DFE portion of ADC/DFE 203 is configured to perform a digital filter operation on the data bits output from the ADC portion of ADC/DFE 203. In various embodiments, the filter operation can include either a real or complex finite impulse response (FIR) filter operation. Using such filtering can compensate for amplitude distortion in the communication channel.

Digital logic circuit 204 is coupled to the output of ADC/DFE 203, and may be configured to generate control signal 210. In various embodiments, digital logic circuit 204 may track values of the data bits. In some embodiments, digital logic circuit 204 may compute a running average of a number of logical-1 data bits, and a running average of a number of logical-0 data bits. Such running averages may be used in control signal 210.

In various embodiments, digital logic circuit 204 may include multiple logic gates coupled together to implement a particular logic function. In some cases, digital logic circuit 204 may include storage circuits, such as, e.g., latch circuits and flip-flop circuits, that may be used to store data and/or implement sequential logic circuits or state machines.

It is noted that the embodiment depicted in FIG. 2 is merely an example. In other embodiments, different circuit blocks and different arrangements of circuit blocks may be employed.

Figure 3:
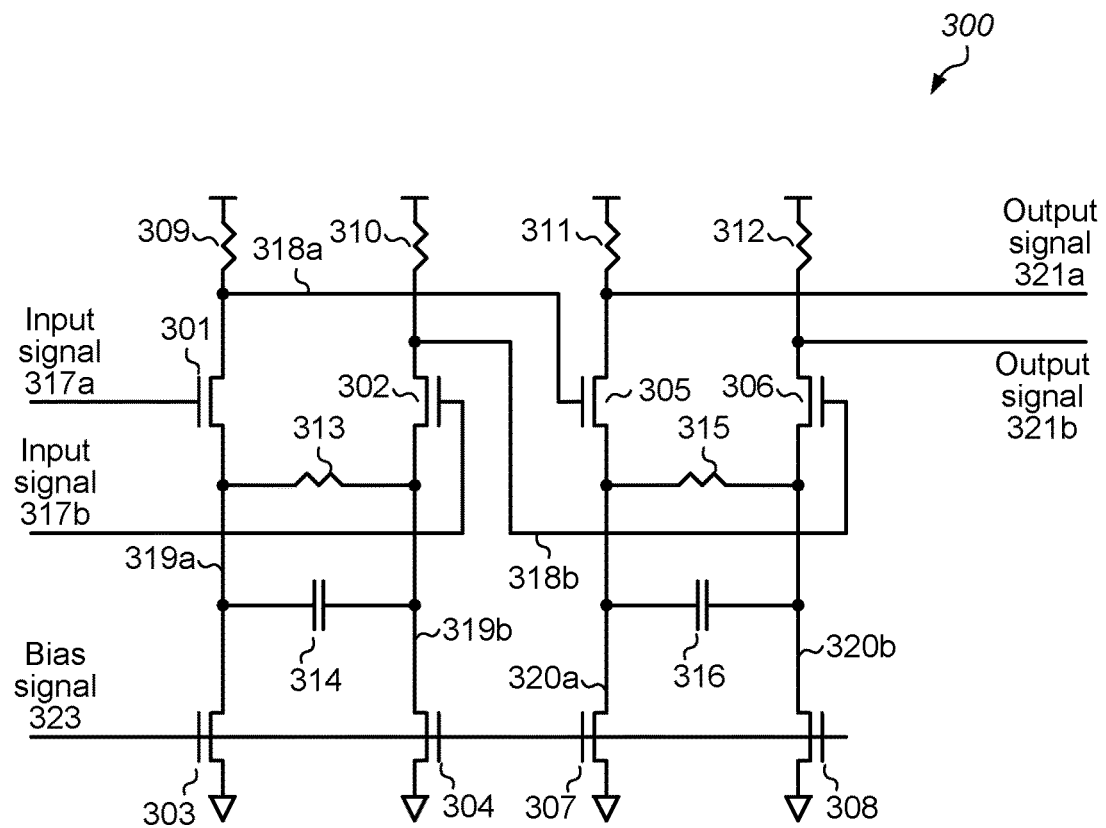
FIG. 3 illustrates an embodiment of an equalizer circuit.

Each of data receivers described above, includes an equalizer circuit. Such circuits may be designed according to numerous design styles. An example of a particular equalizer circuit is illustrated in the embodiment of FIG. 3. In various embodiments, equalizer circuit 300 may correspond to equalizer circuit 101 as illustrated in FIG. 1, or equalizer circuit 201 as depicted in FIG. 2. In the illustrated embodiment, equalizer circuit 300 includes transistors 301 through 308, resistors 309-313 and 315, and capacitors 314 and 316.

Transistor 301 is coupled to nodes 318a and 319a, and is controlled by input signal 317a. Transistor 302 is coupled to node 318b and 319b, and is controlled by input signal 317b. In various embodiments, input signals 317a and 317b may correspond to input signals 105a and 105b as illustrated in FIG. 1.

Transistors, such as, e.g., transistor 301, are particular embodiments of metal-oxide semiconductor field-effect transistors (MOSFETs). It is noted, however, that in other embodiments, any suitable transconductance devices, such as, e.g., bipolar junction transistors, may be employed.

Node 318a is coupled to resistor 309, which is, in turn, coupled to a positive power supply. Node 318b is coupled to resistor 310, which is, in turn coupled to the positive power supply.

Resistor 313 and capacitor 314 are both coupled between nodes 319a and 319b. Transistor 303 is coupled to node 319a, and transistor 304 is coupled to node 319b. Both transistor 303 and transistor 304 are controlled by bias signal 323. In various embodiments, bias signal 323 may be an analog signal generated external to equalizer circuit 300. The operating point of equalizer circuit 300 may be based upon a voltage level of bias signal 323.

Transistor 305 is coupled to output signal 321a and node 320a, and is controlled by node 318a. Transistor 306 is coupled to output signal 321b and node 320b, and is controlled by node 318b. In various embodiments, output signals 321a and 321b may correspond to output signals 106a and 106b as illustrated in FIG. 1.

Output signal 321a is coupled to resistor 311, which is, in turn, coupled to the positive power supply. Output signal 321b is coupled to resistor 312, which is, in turn coupled to the positive power supply.

Resistor 315 and capacitor 316 are both coupled between nodes 320a and 320b. Transistor 307 is coupled to node 320a, and transistor 308 is coupled to node 320b. Both transistor 307 and transistor 308 are controlled by bias signal 323.

During operation, equalizer circuit 300 may implement a high pass transfer function to compensate for loss in a communication channel or link through which input signals 317a and 317b are transmitted. To accomplish two stages of frequency dependent amplification are employed. Transistors 301 and 302 amplify a difference in the voltage levels of input signals 317a and 317b to generate signals on nodes 318a and 318b. Transistors 305 and 306, in turn, amplify a difference in the voltage levels of nodes 318a and 318b to generate output signals 321a and 321b.

The frequency dependence of the two amplification stages may be determined by the passive circuit elements. Resistor 313 and capacitor 314 determine the zero frequency of the first amplification stage, and the peak gain of the first amplification stage is determined by the values of resistors 309 and 310. In a similar fashion, resistor 315 and capacitor 316 determine the zero frequency of the second amplification stage, and the peak gain of the second amplification stage is determined by the values of resistors 311 and 312. Additionally, resistors 313 and 315 may determine the DC gain of equalizer circuit 300. In some embodiments, values of resistors 313 and 315 may be adjusted based on a control signal, such as control signal 109, for example.

It is noted that the embodiment depicted in FIG. 3 is merely an example. In other embodiments, different transistors and different arrangements of transistors may be employed.

Figure 4:
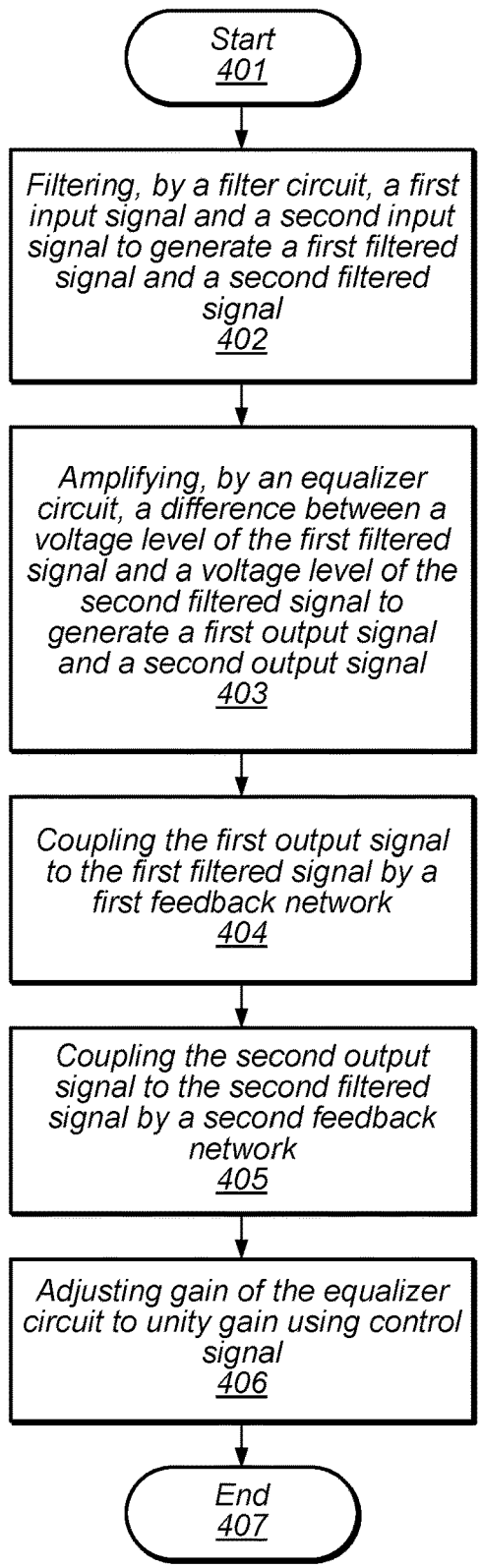
FIG. 4 is a flow diagram depicting an embodiment of a method for correcting baseline wander associated with a data receiver circuit.

Turning to FIG. 4, an embodiment of a method for correcting baseline wander associated with a data receiver circuit, such as, e.g., data receiver circuit 100 as depicted in FIG. 1, is illustrated. The method begins in block 401.

A filter circuit may then filter a first input signal and a second input signal to generate a first filtered signal and a second filtered circuit (block 402). In various embodiments, the first input signal and the second input signal may be received via a communication link. In some embodiments, a difference between the voltage levels of the first input signal and the second input signal may correspond to a logic value of a data bit.

An equalizer circuit may then amplify the difference between the voltage levels of the first and second filtered signals to generate first and second output signals (block 403). In some cases, an operating point of the equalizer circuit may be set using a bias signal, and a gain level of the equalizer circuit may be dependent upon a value of at least one resistor included in the equalizer circuit.

A first feedback network may then couple the first output signal to the first filtered signal (block 404). In various embodiments, the first feedback network may include one or more resistors, or any other suitable passive circuit components. In a similar fashion, a second feedback network may then couple the second output signal to the second filtered signal (block 405). As with the first feedback network, the second feedback network may include any suitable combination of passive circuit components.

The gain of the equalizer circuit may then be adjusted to unity gain using a control signal (block 406). The gain of the equalizer circuit may, in some embodiments, be based on values of data bits received from an input signal. In various embodiments, by reducing the gain of the equalizer circuit to unity gain, the loop time constant of a front-end circuit may be maximized. Although the operations are depicted as being performed in a sequential fashion, in other embodiments, one or more operations, such as, e.g., the operation of block 406, may be performed in parallel with other operations depicted in the flow diagram of FIG. 4.

By coupling the output signals back to their respective filtered signals, variation in the voltage levels of the filtered signals resulting from baseline wander may be reduced, while also reducing design complexity and power dissipation. The method may then conclude in block 407.

It is noted that the embodiment of the method depicted in the flow diagram of FIG. 4 is merely an example. In other embodiments, different operations and different orders of operations are possible and contemplated.

Figure 5:
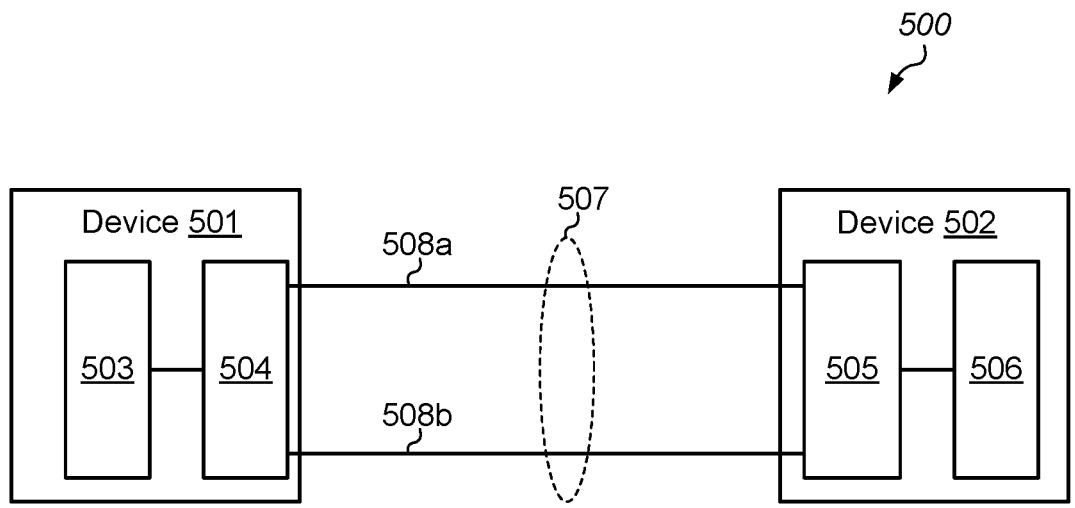
FIG. 5 illustrates an embodiment of a computing system.

As described above, a data receiver circuit, such as, e.g., data receiver circuit 200, may be employed in a computing system. An embodiment of such computing system is illustrated in FIG. 5. In the illustrated embodiment, computing system 500 includes devices 501 and 502, coupled by communication bus 507.

Device 501 includes circuit block 503 and transmitter circuit 504. In various embodiments, device 501 may be a processor, processor core, memory, input/output circuit, analog/mixed signal circuit, or any other suitable circuit block that may be included in an integrated circuit. It is noted that although device 501 is depicted as only including circuit block 503 and transmitter circuit 504, in other embodiments, multiple other circuit sub-blocks may be included in device 501.

Transmitter circuit 504 may be configured to transmit signals via communication bus 507 corresponding to data received from circuit block 503. Such signals may differentially encode one or more data bits, where a difference in between voltage levels of the signals included in wires 508a and 508b correspond to a particular logic level. In some cases, the generation of signals may include encoding the data bits, converting voltage levels associated with the data bits or any other suitable processing. It is noted that although two wires are included in communication bus 507, in other embodiments, any suitable number of signal lines may be employed.

Device 502 includes receiver circuit 505 and circuit block 506. Like device 501, device 502 may be a processor, processor core, memory, or any other suitable circuit block configured to receive data from transmitter circuit 504. Receiver circuit 505 may, in various embodiments, correspond to data receiver circuit 200 as illustrated in FIG. 2, and may be configured to receive signals transmitted on communication bus 507 and convert the received signals to data bits. The data bits may then be sent to circuit block 506 for further processing.

It is noted that devices 501 and 502 may be fabricated on a single silicon substrate, or may be separately fabricated integrated circuits coupled together on a circuit board or other suitable substrate. Although only two devices are depicted in the embodiment of FIG. 5, in other embodiments, any suitable number of devices may be employed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
 a filter circuit configured to filter a first input signal and a second input signal to generate a first filtered signal and a second filtered signal, wherein the first input signal and the second input signal are received via a communication link and encode a plurality of bits;
 a variable gain equalizer circuit coupled to the filter circuit and having a set of internal components, wherein the variable gain equalizer circuit is configured to amplify, using a gain value determined by one of the set of internal components a difference in a first voltage level of the first filtered signal and a second voltage level of the second input signal to generate a first output signal and a second output signal;

a converter circuit configured to generate a plurality of received bits using the first and second output signals;

a logic circuit configured to determine a running average of a number of bits of a particular logic value included in the plurality of received bits;

a first feedback network configured to couple the first output signal of the variable gain equalizer circuit to the first filtered signal;

a second feedback network configured to couple the second output signal to the second filtered signal; and wherein the variable gain equalizer circuit is further configured to change a value of the one of the set of internal components using the running average to adjust the gain value.

2. The apparatus of claim 1, wherein the filter circuit includes a plurality of capacitors.

3. The apparatus of claim 1, wherein the first feedback network includes one or more first resistors, and the second feedback network includes one or more second resistors.

4. The apparatus of claim 1, wherein the filter circuit, the variable gain equalizer circuit, the first feedback network, and the second feedback network are included on a common integrated circuit die.

5. The apparatus of claim 1, wherein the variable gain equalizer circuit includes a first pair of devices coupled to one another using a first capacitor and a first resistor, wherein the first pair of devices includes a first metal-oxide semiconductor field-effect transistor (MOSFET) and a second MOSFET, wherein the first resistor and the first capacitor are coupled between respective source terminals of the first and second MOSFETs, and wherein the variable gain equalizer circuit further includes second pair of devices coupled to one another using a second capacitor and a second resistor, wherein the second pair of devices includes a third MOSFET and a fourth MOSFET, and wherein the second resistor and the second capacitor are coupled between respective source terminals of the third and fourth MOSFETs.

6. The apparatus of claim 5, wherein the variable gain equalizer circuit is further configured to set an operating point using a bias signal.

7. The apparatus of claim 5, wherein to change the value of the one of the set of internal components, the variable gain equalizer circuit is further configured to change a value of at least one of the first resistor or the second resistor using the running average of the particular logic value.

8. A method, comprising:
filtering, by a filter circuit coupled to a communication link, a first input signal to generate a first filtered signal;
filtering, by the filter circuit, a second input signal to generate a second filtered signal, wherein a plurality of bits is encoded using the first input signal and the second input signal;
amplifying, by a variable gain equalizer circuit using a gain value determined by one of a set of internal components of the variable gain equalizer circuit, a difference between respective voltage levels of the first filtered signal and the second filtered signal to generate a first intermediate signal and a second intermediate signal;

amplifying, by the variable gain equalizer circuit using the gain value, a difference in respective voltage levels of the first and second intermediate signals to generate a first output signal and a second output signal;

coupling the first output signal to the first filtered signal by a first feedback network;

coupling the second output signal to the second filtered signal by a second feedback network;

generating a plurality of received bits using the first output signal and the second output signal;

determining a running average of a number of bits of a particular logic value using the plurality of received bits; and changing a value of the one of the set of internal components using the running average of the particular logic value to adjust the gain value.

9. The method of claim 8, wherein filtering, by the filter circuit, the first input signal includes coupling the first input signal to the first filtered signal using a capacitor included in the filter circuit.

10. The method of claim 8, wherein coupling the first output signal to the first filtered signal by a first feedback network includes coupling the first output signal to the first filtered signal using one or more resistors included in the first feedback network.

11. The method of claim 8, wherein the filter circuit, the variable gain equalizer circuit, the first feedback network, and the second feedback network are included on a common integrated circuit die.

12. The method of claim 8, wherein the variable gain equalizer circuit includes a first pair of devices coupled to one another using a first resistor and a first capacitor, wherein the first pair of devices includes a first metal-oxide semiconductor field-effect transistor (MOSFET) and a second MOSFET, wherein the first resistor and the first capacitor are coupled between respective source terminals of the first and second MOSFETs, and wherein the variable gain equalizer circuit includes a second pair of devices coupled to one another using a second resistor and a second capacitor, wherein the second pair of devices includes a third MOSFET and a fourth MOSFET, and wherein the second resistor and the second capacitor are coupled between respective source terminals of the third and fourth MOSFETs.

13. The method of claim 12, wherein changing the value of the one of the set of internal components includes changing a value of at least one of the first resistor or the second resistor using the running average of the particular logic value.

14. A system, comprising:
a first device configured to transmit, using a first signal and a second signal, data that encodes a plurality of bits; and
a second device coupled to the first device via a communication link having a set of internal components, wherein the second device is configured to:
receive, via the communication link, the first signal and the second signal;
filter the first signal to generate a first filtered signal;
filter the second signal to generate a second filtered signal;
amplify, using a gain value, a difference between respective voltage levels of the first filtered signal and the second filtered signal to generate a first output signal and a second output signal;
correct baseline wander associated with the communication link using the first filtered signal and the second filtered signal;

extract the plurality of bits using the first output signal and the second output signal to generate a plurality of received bits;

determine a running average of a number of bits of a particular logic value included in the plurality of received bits; and adjust the gain value using the running average.

15. The system of claim 14, wherein to filter the first signal, the second device is further configured to couple the first signal to the first filtered signal using a capacitor.

16. The system of claim 14 wherein the second device is further configured to amplify the difference in the respective voltage levels of the first filtered signal and the second filtered signal using a bias signal.

17. The system of claim 15, the second device is further configured to couple, using one or more resistors, the first output signal to the first filtered signal.

18. The system of claim 17, wherein the second device, the capacitor, and the one or more resistors are included on a common integrated circuit die.

19. The system of claim 18, wherein the second device includes a first pair of devices coupled to one another using a first resistor and a first capacitor, wherein the first pair of devices includes a first metal-oxide semiconductor field-effect transistor (MOSFET) and a second MOSFET, wherein the first resistor and the first capacitor are coupled between respective source terminals of the first and second MOSFETs, and wherein the second device further includes a second pair of devices coupled to one another using a second resistor and a second capacitor, wherein the second pair of devices includes a third MOSFET and a fourth MOSFET, and wherein the second resistor and the second capacitor are coupled between respective source terminals of the third and fourth MOSFETs.

* * * * *